United States Patent
Bodö et al.

[11] Patent Number: 6,042,391
[45] Date of Patent: Mar. 28, 2000

[54] HIGH DENSITY ELECTRICAL CONNECTORS

[75] Inventors: Peter Bodö, Lindköping; Hjalmar Hesselbom, Huddinge, both of Sweden

[73] Assignee: Telefonaktiebolaget LM Ericsson, Stockholm, Sweden

[21] Appl. No.: 08/994,985

[22] Filed: Dec. 19, 1997

[30] Foreign Application Priority Data

Dec. 19, 1996 [SE] Sweden .................................. 9604677

[51] Int. Cl.[7] .................................................. H01R 9/09
[52] U.S. Cl. ............................................. 439/74; 257/686
[58] Field of Search ............................. 439/284, 74, 67; 257/723, 739, 700, 777, 686

[56] References Cited

U.S. PATENT DOCUMENTS

| | | | |
|---|---|---|---|
| 3,465,435 | 9/1969 | Steranko | 439/74 |
| 3,553,633 | 1/1971 | Ondrejka | 439/277 |
| 5,071,363 | 12/1991 | Reylek et al. | 439/291 |
| 5,097,101 | 3/1992 | Trobough | 439/67 |
| 5,118,299 | 6/1992 | Burns et al. | 439/74 |
| 5,121,299 | 6/1992 | Frankeny et al. | 439/74 |
| 5,340,296 | 8/1994 | Schreiber et al. | 425/123 |
| 5,525,065 | 6/1996 | Sobhani | 439/67 |
| 5,743,747 | 4/1998 | Sobhani | 439/67 |

FOREIGN PATENT DOCUMENTS

| | | |
|---|---|---|
| 0295914A2 | 12/1988 | European Pat. Off. . |
| 0439134A2 | 7/1991 | European Pat. Off. . |
| 4438053A1 | 5/1996 | Germany . |

OTHER PUBLICATIONS

PCT International Search Report, Dec. 19, 1996.

*Primary Examiner*—Neil Abrams
*Assistant Examiner*—Hae Moon Hyeon
*Attorney, Agent, or Firm*—Burns, Doane, Swecker & Mathis, L.L.P.

[57] ABSTRACT

A self-aligning, flexible high density and impedance adjusted electrical connectors for use in microelectronic systems for overcoming the problem of having electrical connection and alignment at the same time is disclosed. The connector comprises a first part (204) consisting of two metal layer structures, a first signal path (212) and a first ground path (210) covering a V-groove (202), and a second part (208) consisting of corresponding metal layers of the first part, a second signal path (224) covering an elastic bump (206) and a second signal ground plane (226) which fits into the V-groove (202). The first and the second signal paths are in contact with each other when the first and the second parts are brought together and the contact is self-aligning when put together. The electrical contact will remain despite displacement due to thermal expansion.

5 Claims, 5 Drawing Sheets

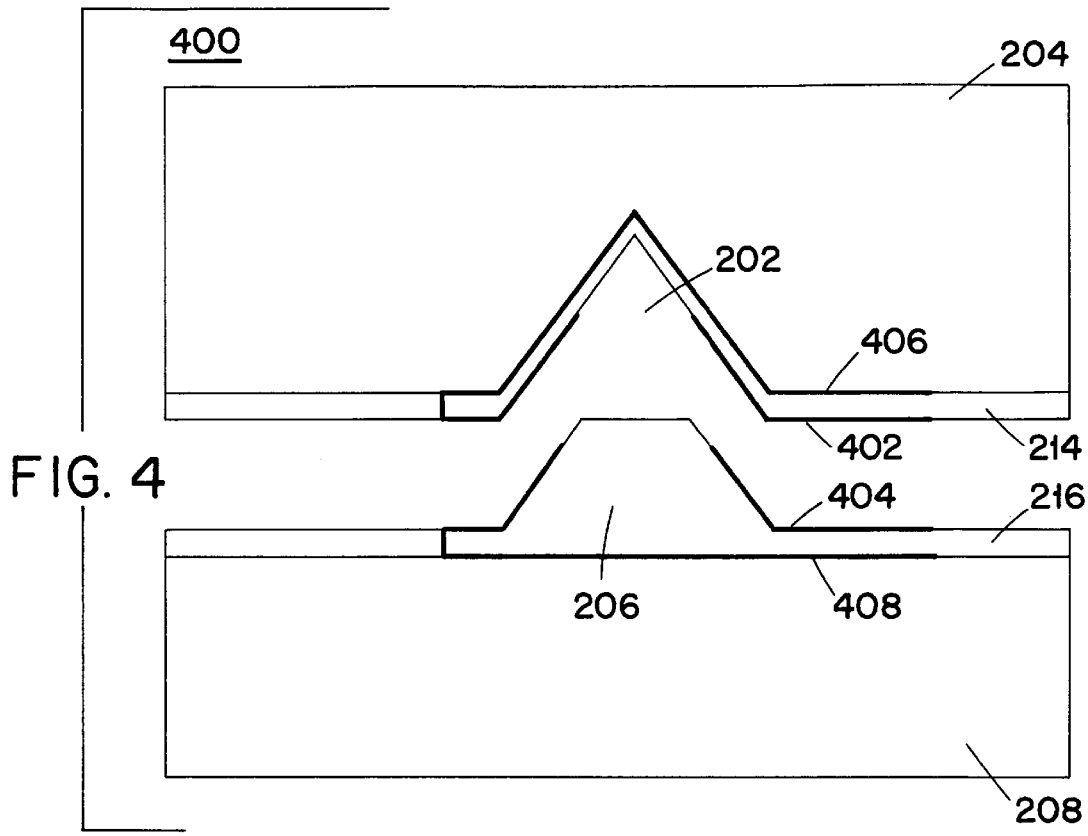
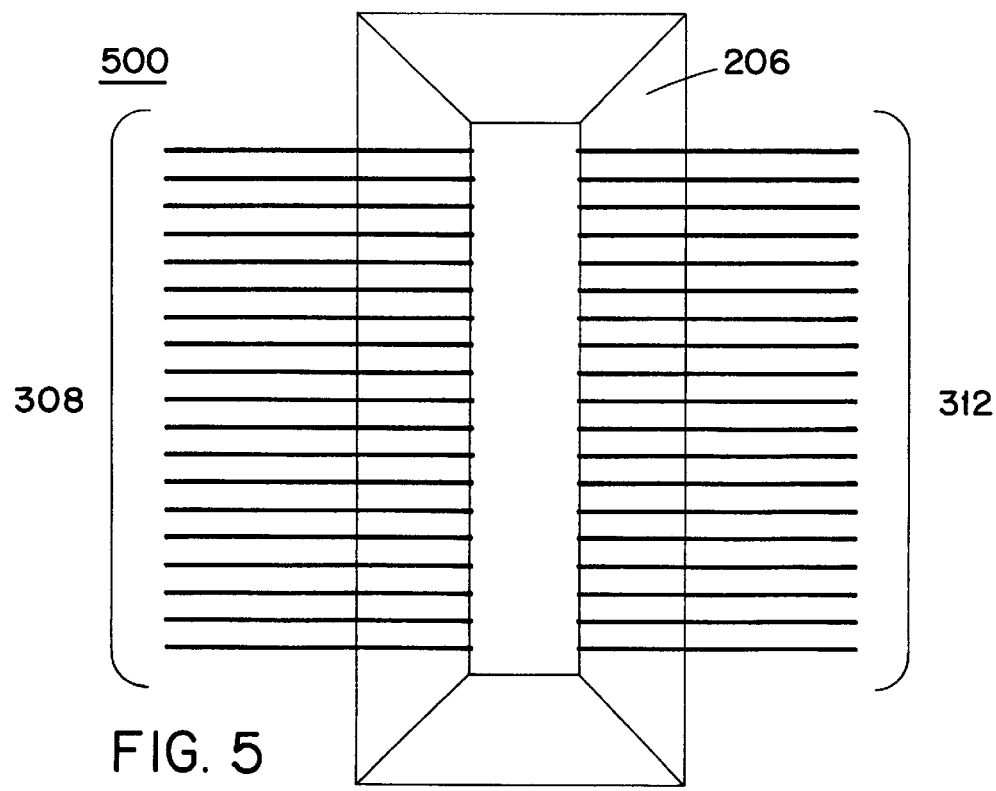

HIGH DENSITY ELECTRICAL CONNECTORS

TECHNICAL FIELD OF THE INVENTION

The present invention relates to interconnection of electric devices, more particular to self-aligned, flexible high density and impedance adjusted electrical connectors.

DESCRIPTION OF RELATED ART

The technical evolution in the field of integrated circuits, IC:s, has resulted in a demand for faster and more compact systems. In many applications a compact structure combined with a low weight is in itself a requirement. The technical evolution also tends towards more complex systems involving a greater and greater number of components which need to communicate with each other. In order for the new systems to meet the requirement of quick access between different components, the length of the paths between different components of the system must be kept within certain limits.

When the complexity of a system grows, the length of the paths between components also grows. In order not to exceed the maximum usable distance between such components, these components have been built smaller and smaller and they have also been packed more and more densely. Thus, multi-chip modules have been developed, which makes a very dense packaging of unencapsulated IC:s possible.

In fact, the distance between different active components do not become much larger than if the whole system had been integrated on the same plane monolith. The maximal distance, determined by the performance requirements, between components which need to communicate with each other in a complex system becomes unnecessarily large if only one plane of connected chips/components can be used, since only components in the same plane then can be reached within the maximal distance.

Three dimensional constructions can be used to overcome this problem. This means that the communication lines extending from one component can not only reach components in the same plane but also components in planes located above and underneath the component can be directly accessed. This can be obtained in some different manners: firstly, systems having modules connected to a back plane; secondly, systems consisting of chips glued together; thirdly, systems having vertical connections at the side of a tower built of chips are in one sense three dimensional. These three dimensional constructions do not solve the problem with short paths between all components. This can not be achieved when components are close in space and are connected by long lines. This becomes obvious when two components are connected according to the first of the methods described above, e.g. connection of two centrally located components on two different neighbouring multi-chip modules, which are in their turn connected through a lateral path, a short vertical path at the side of the chips, and then a final lateral path on the other chip. If more than one pile of chips is used, the second described method does not either make short interconnection lines between adjacent chips possible. This is easily realised if one considers the case of two chips located next to each other, but on the top of each pile, which are to communicate with each other.

As the complexity of electronic circuits increases there is a growing demand on the density of in/out-connections having properties not to deteriorate the performance, i.e. impedance adjustment or negligible inductance/capacitance. As the density increases the demand on alignment is also increased and the greater this demand the more important becomes the use of self-aligning procedures due to the accelerating costs of active alignment at high precision.

When connecting parts of a complex system, the risk of having to replace one or more of these parts to obtain a functioning system increases with the complexity of the system. The difficulty accelerates to fully test the constituent parts at relevant frequencies and operating conditions.

There are concepts that use high density micro bumps, but these are not really impedance controlled, which also implies quasi impedance control.

The European patent application 0 295 914 A3, Maracos Karnezos, describes elastic bumps which are metallized. The bumps are used to connect two surfaces electrically through clamp connection. Through the elasticity almost all thermal induced mechanical stress can be eliminated. Conducting surfaces can be separated without disordering.

SUMMARY

This invention describes a technology to achieve elastic electrical connectors which are impedance controlled, have high density of interconnects and are high precision self-aligned during mounting and under performance. The functions of alignment and electrical interconnect are in the same structure. The alignment is based on protruding V-shaped bumps in one part and V-grooves in the other part. The groove may be of 5 corner pentahedron or pyramidical form and the bump may be of truncated 5 corner pentahedron or truncated pyramidical form. The bumps and grooves have corresponding connector paths.

The basic idea with this invention is that it is using the alignment of the structure itself. This means that the site of multiple contact points may be obtained by high impedance controlled contact densities, while the aligning structure is relatively much larger. This results in high precision and at the same time elastic connections. This invention handles minor imperfections in the metal or other layers and possible thermal mismatch when in use. Simultaneous multiple, more than three, connections require individual contact point flexibility or deformability or else, the demand on precision, i.e. the requirement that all the contact points be in the same plane, will be enormous and hardly realisable.

This invention has a multi-path impedance controlled very high density bus, made by patterning metal lines, e.g. paths, on a precision moulded elastic bump which mates to similarly patterned lines on the walls of a precision etched groove.

This invention is able to obtain impedance adjusted high density multi-path connectors at no physical fan out using low cost lithography and Si micro structure technology. It is also a self-aligning concept requiring no separate body and made essentially simultaneously with the patterning of the metal interconnects on the substrate utilising a pre-made change of the structure of the substrates.

This invention could be used in various microelectronic systems, for instance miniature high density modules, between modules and motherboards, between ICs and modules or boards, between different levels in 3D structures, or generally as a very high density dismountable connection between substrates.

In many cases there is a requirement to be able to disassemble electronic systems and to put them back again without using soldering or equivalent. This implies using connectors. There are numerous connectors available, but none that has the density corresponding to this one, which is both impedance controlled, for frequencies up to several GHz, as well as very high density, i.e. without requiring physical fan out. The elasticity is an important feature securing sufficient contact pressure for all paths even if there are slight physical defects or variation in size due to different thermal or other expansions. Regarding alignment, many connectors utilise the contact points for alignment. For very small sizes of the individual contact points, this would require a high degree of pre-alignment or might lead to destruction when forcing alignment. Instead, elastic alignment structures and corresponding mating grooves are patterned with similar metal lines which are part of the metal lines extending from the circuit. This implies that a robust alignment yet at very high precision is obtained, and which does not occupy extra space. By making ground paths or planes and contact paths in the grooves and also make similar ground paths on the substrate and contact paths on the bumps it will result in an connector structure. With the exception of the formation of the bump and the groove, which requires simple extra steps, the contact points and the connection of the electrical lines are integral to the general interconnect patterning processes.

One advantage of the present invention is that it offers a solution for systems where very short electrical pathways are required.

Another advantage of the present invention is that it offers a compact packaging system.

A further advantage of the present invention is that the hole system is easy to repair and, because of that, individual parts are easy to replace and it could be done without any real costs or potential damages associated with the removal of faulty parts. An attachment does not involve soldering or gluing etc.

The invention is now being described further with the help of the detailed description of the preferred embodiments and the attached drawings.

BRIEF DESCRIPTION OF THE DRAWINGS

FIG. 4 shows an alternative schematic cross-section of self-aligned and impedance adjusted connector with ground paths following the signal paths through the connector.

FIG. 5 shows a schematic top view of the FIG. 3.

DETAILED DESCRIPTION OF EMBODIMENTS

This invention can be used in various micro-electronic systems, which are used for elastic electrical contacts and built-in chip alignment. It could be used in multi-chip modules, especially where it is hard to determine the quality of chips before they are mounted. The invention would be used where there presently are several problems, e.g. with flip-chip or on board due to high mis-match of thermal expansion coefficients between board and chip. Repair can often be risky and expensive and, in some types of MCM, essentially impossible.

Figure 1:
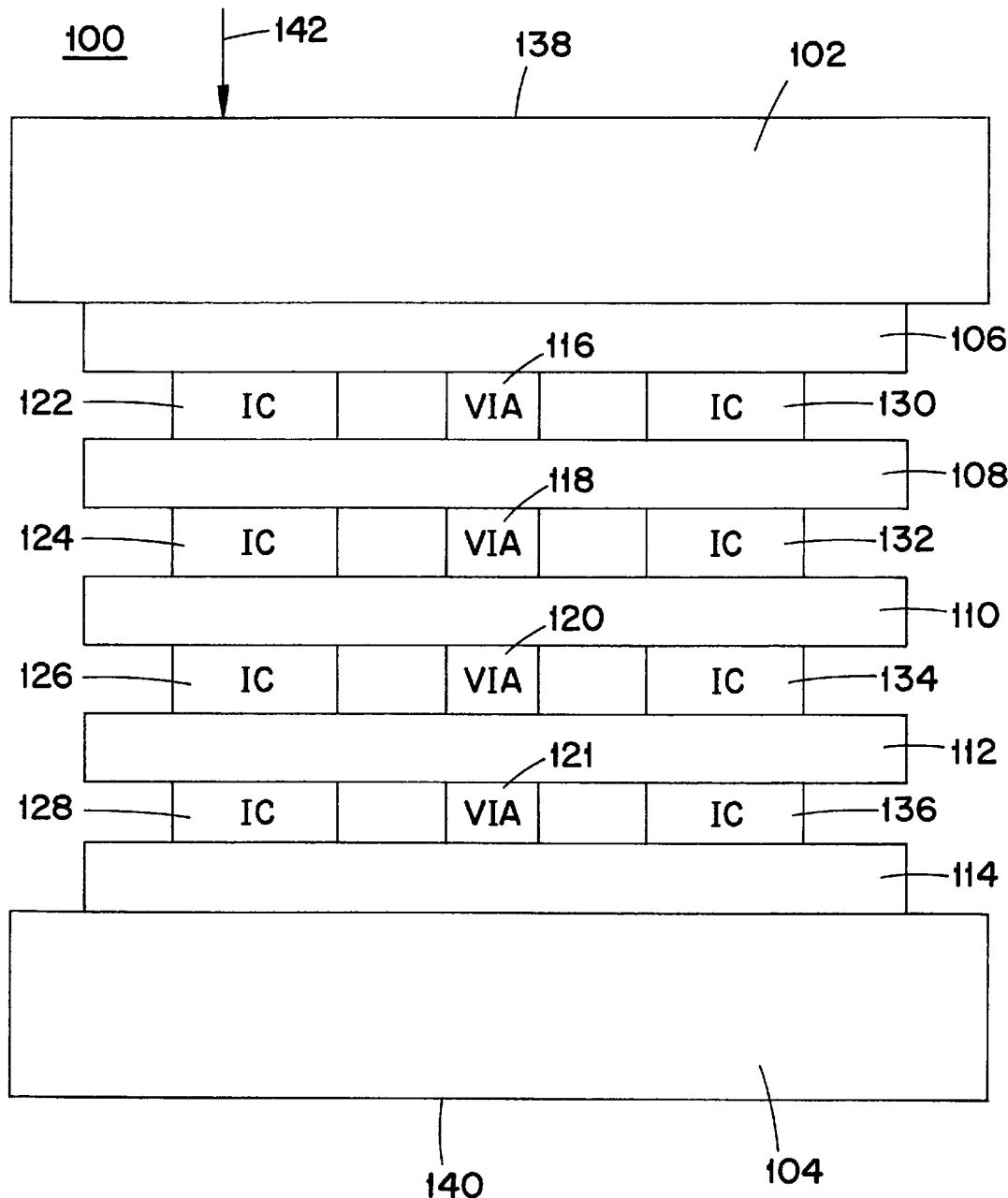
FIG. 1 shows a cross-section of a three dimensional multi-chip module.

FIG. 1 shows an example where this invention can be used, but it is not restricted to this area. This invention can of course be used in any kind of micro or even sub-micro systems. FIG. 1 shows a cross section for a three dimensional, 3D, multi-chip module 100. The 3D module is formed by two dimensional, 2D, multi-chip modules consisting of Si substrates 106–114 having integrated circuit chips 122–136 mounted thereon. The Si substrates 106–114 are provided with a grounded plane whereby a good screening is obtained between the different planes of the module as well as for the entire 3D multi-chip module 100. On the substrate 106–114, in particular the ones not located at the top 106 or the bottom 114 of the stack of two dimensional, 2D, multi-chip modules, there are also mounted passive chips, via chips or vias 116–121 constituting interconnections between adjacent levels of the 3D multi-chip module 100.

Figure 2:
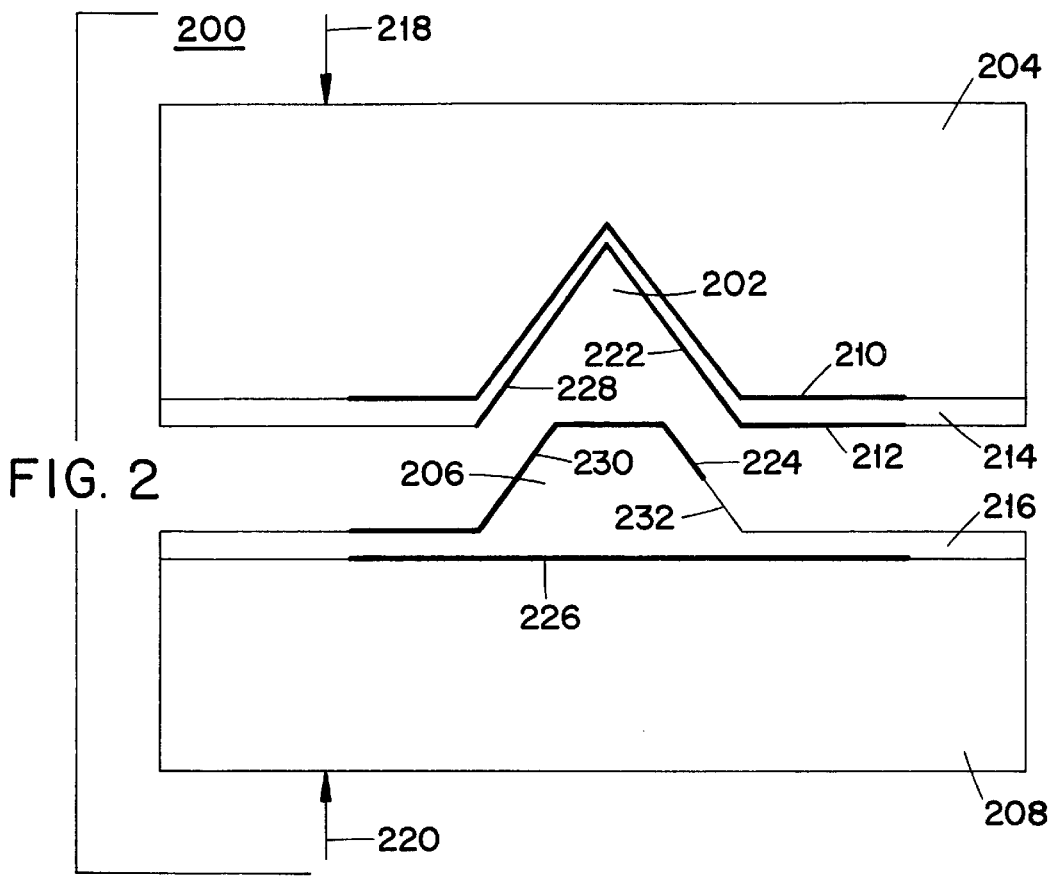
FIG. 2 shows a schematic cross-section of self-aligned and impedance adjusted connector.

In order to obtain impedance matched connectors, see FIG. 2, V-groove etched contact grooves 202 are used. On the top of the via chips 116–121 elastic bump structures 206 are applied and on the backsides of the substrates V-shaped contact grooves 202 are made, which are provided for obtaining a connection which is easy to assemble/disassemble and for obtaining a good alignment, see simultaneously filed patent application "Packaging structure for integrated circuits".

The IC chips 122–136 and the via chips 116–121 are, in the preferred embodiment, flip-chip mounted on the substrates 106–114. This arrangement makes it possible to provide a good thermal contact between the backsides of the flip-chip mounted IC chips 122–136 and the backside of the adjacent substrates 106–114.

Each level of the IC chip 122–136 and each individual via chip 116–121 of the 3D multi-chip module 100 is only kept together by a compressing force 142 applied on top plane 138 of the top cooler 102 and bottom plane 140 of the bottom cooler 104 of the structure.

In order to accomplish this piled structure, elastic bumps are provided which connect via chips 116–121 to adjacent planes of the substrates 106–114, and contact is obtained by pressing the module together at the top plane 138 and the bottom plane 140 of the cooler 102, 104. The compressing force 142 is provided by means of clamps applied to the outermost part of the module 100.

Patterned metal layers are used to establish multiple electrical pressure type, non permanent, connections which are impedance adjusted for high speed data transmission.

FIG. 2 shows a cross-section of one such connector structure 200. A first part 204 consists of two metal layer structures, a first signal path 212 and a first ground path or plane 210 with a dielectric between them, covering the anisotropically etched V-groove 202. A second part 208 consists of corresponding metal layers, a second ground plane 226, and a second signal path 224 covering the elastic bump 206, which fits into the V-groove 202. The first and the second signal path 212 and 224 are in contact with each other when the first and the second part 204 and 208 are brought together. The contact is self aligned when put together, see a simultaneously filed patent application "Bumps in grooves for elastic positioning". Because of the elastic bump 206, electrical contact will remain even if displacement due to, for example, the thermal expansion occurs. The first and the second signal paths 212, 224, configured as in FIG. 2 implies double safety since both side walls of the elastic bump 206 and the V-groove 202, respectively, are covered with the same paths. In other words, if large displacement occurs and only one side wall of the bump 206 is touching the V-groove 202, then electrical contact will still remain. The first and the second ground paths or planes 210, 226 consist of any suitable metal. The first signal path metal 212 needs to be a metal free from any insulating surface oxide layer, i.e. any noble metal. The second signal path metal 224 needs to be a ductile metal free from any insulating surface oxide layer, e.g. gold. The paths and ground metal layers are separated by dielectric layers 214 and 216. The first dielectric layer 214 consist of any dielectric layer conformally covering the V-groove walls, e.g. Parylene. The second dielectric layer 224 consist of any dielectric layer, or of the same elastic material as in the bump 206.

This invention is based on high precision, elastic alignment of two parts of any function, where elastic bumps are simultaneously used for high precision alignment and flexible, elastic, electrical connectors. Patterned metal layers are used to establish multiple electrical pressure type, non permanent connections. These connections are impedance adjusted for high speed data transmission.

The most precise alignment will be obtained when the alignment groove 202 is made using anisotropic etching of e.g. Si (100) wafer. Likewise, the most perfect elastic bump 206 will be formed by using: an anisotropically etched (100) Si wafer and high precision lithography, a conformally covering release agent layer, and a curable silicone compound. In simultaneously filed patent applications "Method for making elastic bumps" and "Bumps in grooves for elastic positioning" are described a more detailed way of how the bumps and the grooves are made and aligned thereof. When the V-groove 202 and the truncated bump 206 have been made, parts will be placed by some pre-alignment such that the top of the bump 206 is within the periphery of the groove 202. By cautiously applying pressure 218, 220, possibly gravity, inclined walls 230, 232 of the bump will slide on inclined walls 222, 228 to get very precise alignment in the directions parallel to a base surface of the bump 206 or the groove 202 and then aligning the bump 206 in the groove 202. The paths 212, 224 which were placed at high precision using lithography relative to the bump 206 in the groove 202 are automatically aligned and, utilising the elasticity of the bump 206, the paths 212, 224, will contact its counterpart regardless of minute thickness, metal roughness due to micro crystallisation etc., differences. Also, due to the elasticity, small differences in expansion between the parts 204, 208 could occur without losing contact or exposing the parts 204, 208 for severe strain.

How to make the connector 200 is hereby described. A polished (100) silicon wafer, this wafer is from here on referred to as the mould wafer, is covered using SiN after which resist is deposited and patterned using a mask which is well aligned relative to the crystal axis directions of the mould wafer.

Openings as defined by the mask are then etched in the SiN layer, then the mould wafer is exposed to an anisotrophic etchant, which produces grooves which side walls are limited by the silicon (111) planes. The etch may be continued until complete, elongated, structure has been etched or preferably may be stopped prior to this, such that truncated, elongated, structure is formed.

A similar, but mirrored, mask which with very high precision, replicates the first mask is then used to, by equivalent procedure, obtain similar but mirrored grooves in a wafer which contains the parts which are to be aligned. These grooves must be as deep or deeper than those in the first wafer. The mould wafer may also contain some further alignment structures to enable it to be self aligned to the substrate onto which the elastic bumps are moulded. The mould wafer is covered with some release agent, which is deposited very thinly and conformally in order to preserve the precise geometry. For the part to be provided with bumps, the most rational procedure is to first create the metal and dielectric layers as usual. Either the plate with the unseparated substrates or the mould wafer is then covered with a curable elastic compound to a controlled thickness using spinning, scraping or spraying. Then the mould wafer and the unseparated substrates are pressed using the alignment features for precision alignment of the bumps versus the substrate structures, allowing the compound to wet the opposing surfaces. The package is then possibly placed in a vacuum to remove air bubbles, and then at elevated temperature to cure the compound. The mould wafer is then separated from the substrate. Using stiff mould wafers and substrates, this would be done in a vacuum, due to the hermetic fit of the compound to the mould. For special applications, the substrate could be made of flexible material, which would facilitate separation.

For the bump structure part, the most rational procedure is to first create the metal layer 226 and the dielectric layer 214 as usual, then to make the bump, then a separate metal path 224 is patterned over the bump and makes contact to the previous metal layers through vias. It would, in principle, be possible to first make the ground path or plane, then continue with the depositions of metals and dielectric on the bump. This would, however, exclude the possibility to pass lines or ground planes beneath the bump and it is not always the case that the various dielectric and metal paths would be flexible enough to survive on the flexing bump.

By using photolithographic masking aligned to already existing structures on e.g. lasers or ICs or substrates before they have been separated, grooves are made either using anisotropic etching or other techniques. The grooved part 204 is then processed normally, i.e. depositing the metal layer 210 and dielectric layer 214, with the exception that the dielectric layers 214 and patterning the metal path 212 have to be deposited conformally, in order to preserve the alignment properties of the groove 202. Also, the resist has to be deposited sufficiently conformally to allow resolution of the exposed pattern in the resist and the depth of focus of the exposing equipment must be sufficient.

After separation of the grooves etc., they may now be placed onto the bumped part, self-aligning grooves with the bumps. Depending on the shape and size of the bumps and the grooves the degree of pre-alignment varies.

It would, in principle, be possible to first make the general deposition and patterning of the dielectric layer and metal path, then to etch away metal and dielectric from the area of the groove, pattern and etch the groove, further to re-deposit and pattern the metal path and the dielectric and resist, which would only be used locally.

As the parts are mating together using external pressure no permanent attachment is made, allowing the part to be easily separated from its aligning structure for replacement or repair.

In the thin parts of the moulded material outside of the bump, vias are formed to the metal paths, which are to be contacted very close to the bump.

Figure 3:
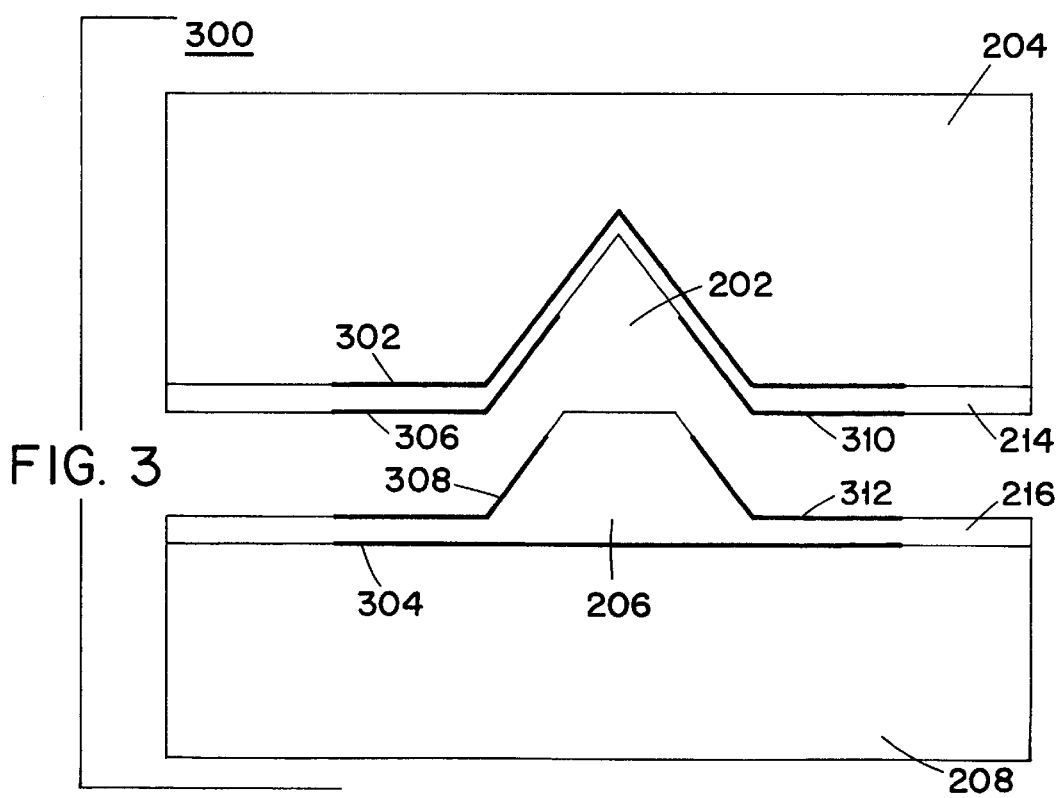
FIG. 3 shows an alternative schematic cross-section of self-aligned and impedance adjusted connector with double density conductors.

In FIG. 3; a first alternative embodiment described. This figure shows a possibility of having a double density connector. The manufacturing process steps and materials involved are identical with the case described in FIG. 2. However, in this case shown in FIG. 3, there are two different paths on each side of the bump as well as the groove. The paths pattern is also illustrated in the schematic top view of a bus contact in FIG. 5.

A second alternative embodiment of the present invention is described in FIG. 4. The manufacturing process steps and materials involved are identical with the case described in FIG. 2 except that the ground plane is connected up to the level of the signal lines using vias. FIG. 4 shows schematically a cross-section of self aligned and impedance adjusted connector with ground paths following the signal paths through the connector. To achieve ultimate electrical performance, both the signal line and the ground plane are connected at essentially the same position using the same elastic bump.

FIG. 5 shows schematically a top view of self aligned and impedance adjusted connector with double density conductors of the alternative embodiment, FIG. 3.

Figure 6A:
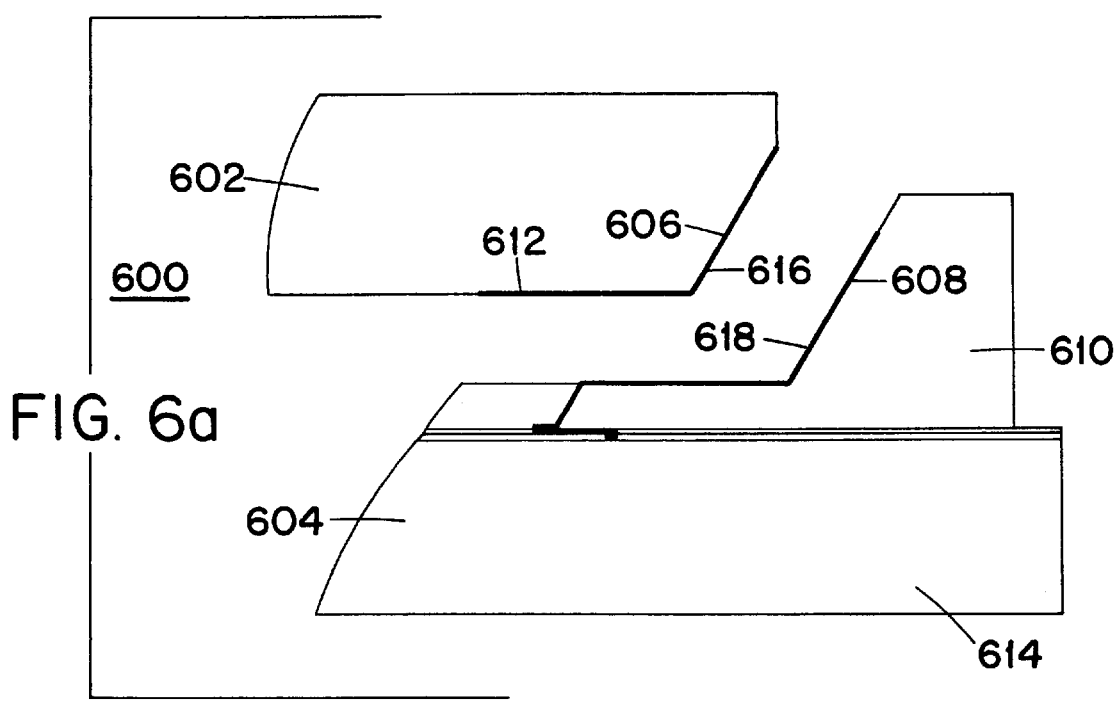
FIGS. 6a–b show a cross section of an alternative connector.
Figure 6B:
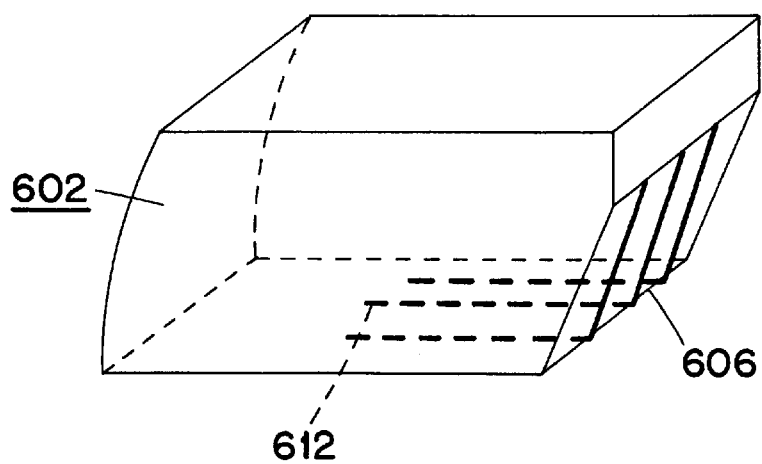

FIGS. 6a–b show a cross section of an alternative connector 600. The connector 600 has a first part 602 and a second part 604. The first part has signal paths 606 along the edge of the part 602, see FIG. 6b, connected to contact pads 612 at bottom of the first part. The second part 604 has a guiding frame 610 on a substrate 614 and signal paths 608 along the guiding frame 610. The two parts have such a structure that at least one edge of each of the parts have inclined walls 616, 618. If chips are provided with inclined walls, the normal pads could be exchanged with paths extending over the inclined walls and mating the guiding frame with patterned metal paths as described earlier.

The previously described preferred embodiment could be modified, but at some loss of precision. The bumps could have a different shape than the grooves. For this, one would not use anisotrophic etching, but rather some other etching, or machining. For this, the grooves and the bumps do not have to have the same shape as long as the bump would fit in the groove, in a self centering fashion, and contacts were being made. The compound could be other than Silicone, e.g. polyurethane or some other elastic or semi-elastic compound.

By replicating using several steps, a flexible mould could be made, facilitating the detachment of the mould from the substrate but only at a loss of accuracy.

Assuming that the metal patterning resolution is better than the minimum size of the bumps, the preferred embodiment gives the highest contact density in one dimension, i.e. the closest possible line spacing. If the minimum size of the bumps is equivalent to the metal patterning resolution, it would be possible to obtain higher contact densities per area. In this case, self centering multiple super micro bumps are densely packed on a surface, where the metal is patterned not on the bump but outside the bump.

In this case, the connections would also appear to be impedance controlled due to the very small size of the bumps. This, however, would be much harder to pre-align as the peak of the bump must be within the perimeter of the now very small groove, unless there are also some gross alignment features in the structure.

If elastic material could be "perfectly" conformally deposited on the walls of the groove, a stiff bump could be used instead. One way to accomplish this would probably be to use a mould, which would fill part of, but not all of the groove so as to leave a thin distance to the groove walls where the elastic compound would cure.

There are several possible applications for the present type of connection. Bus contacts between MCMs in the same plane, or also vertical signal transmission between stacked MCMs are achievable, in combination with through-hole vias. In combination with different fan out schemes as required, these can be used as general fine pitch high frequency connectors. They would occupy much less space per connection than conventional electrical ones, while maintaining correct characteristic impedance. This is due to the fine pitch and high alignment, and the fact that the ground plane is brought into contact point.

Except for standard process technology for fabrication of electronic devices, this connector device requires processes such as a V-groove etching, casting of bumps, deposition of conformal insulator coating, and lithography over large steps. All of this can be achieved by existing or modified semiconductor/thin film processes.

In order to get maximum precision, there must be means to cover the mould with releasing agents as very conformal and thin layers. Methods for this were described above. For this maximum precision case, single crystals with surfaces well aligned to the crystal directions that can be used for anisotrophic etching are available as commercial Si-wafers.

The dielectric metal and resist layers are required to be deposited relatively conformally, in comparison to the layer thickness and topography of the groove and the bump. For the metal layer deposition, this is normally the case using standard thin film deposition techniques. For the dielectric, spin-coating can most likely not be used, limiting the choice of materials. However, there are still a number of materials and processes to choose from, e.g. the Parylene method. The choice of resist becomes more narrow as the vast majority of resists are made to be deposited by spin-coating, which is not deemed possible in this case. There are still two known alternatives. One is using novel resist materials, which are deposited by evaporation in vacuum. For this method, there is no real commercial process available, but there exist commercially available materials, which have resist properties and can be deposited this way. The other alternative is a type of resist, which is electroplated. It is commercially available and primarily used to protect the metal in through-plated holes on printed circuit boards. These electroplated resists require that there be a metal layer which can be biased for growth to occur, which will be the case as the only layer that needs to be patterned on the bumps and in the grooves are the metal layers. The dielectric also needs to be patterned to get vias, however this will not be on the bumps or in the grooves but rather outside of these where more conventional resists can be used provided they cover the hole or the groove to allow patterning, even if they are too unevenly thick. It is also possible to deposit and pattern a metal hard mask for patterning of the dielectric.

Using micro machining technologies, very high density connectors have been shown to create micro parts looking much the same as conventional connectors, but being much smaller in size. These are edge type connectors and can, in principle, be made so small that they require no physical fan out of the line pattern. However, they are not made as an integral part of the metallization. Instead, they are separate parts that require soldering or equivalent to be used. Little is known about their robustness and wear resistance.

Elastic bumps have been shown to be used for single path purposes. Here each path has one separate bump mating a surface on the opposing substrate. In principle these could be made as small as to not require physical fan out. In this case they could also be regarded as impedance controlled. However, these schemes lack any inherent means of alignment.

Solutions requiring separate micro parts that have to be individually precision handled will never be very cheap compared to thin film like processes where many items pre-placed are produced with lithographic methods.

Figure 7:
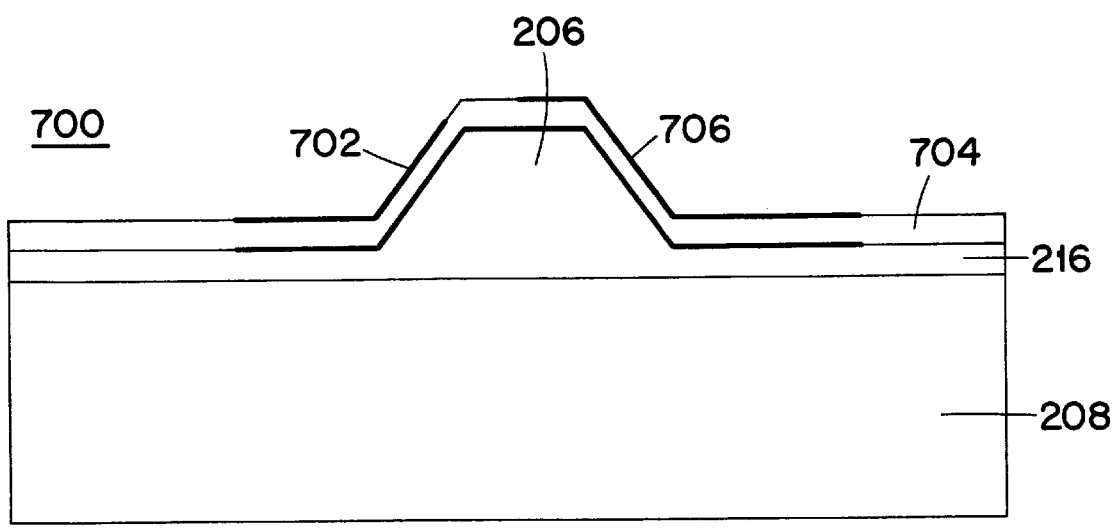
FIG. 7 shows a cross-section of an alternative double density connector with conductors.

FIG. 7 shows a cross section of an alternative connector bump 700. The connector bump consist of a two metal layer structure, a dielectric medium 704 and a elastic structure 216. The metal layer structure can be a ground path or plane 702 and a signal path 706. The ground plane 702 is made on the bump 206 where the bump is including in the elastic structure 216. The ground plane also has a connection through the dielectric medium 704 up over and covering partly the dielectric medium 704. The other metal layer structure, the signal path 706, is made on the dielectric medium 704.

The invention described above may be embodied in yet another specific forms without departing from the spirit or essential characteristics thereof. Thus, the present embodiments are to be considered in all respects as illustrative and not restrictive, the scope of the invention being indicated by the appended claims rather than by the foregoing descriptions, and all changes which come within the meaning and range of equivalency of the claims are therefore intended to be embraced therein.

We claim:

1. A connector comprising:
    a first part having at least one inclined wall, a plurality of V-grooves and at least one conducting path; and
    a second part having at least one inclined wall, an elastic bump structure, and at least one conducting path such that a bump from the bump structure fits into a V-groove, the wall belonging to the second part having the same inclination as the wall belonging to the first part, wherein the conducting path associated with the first part is in contact with the conducting path associated with the second part when the first and second parts are mated together.

2. The connector of claim 1 wherein the first part further comprises:
    a two metal layer structure;
    at least one first signal path; and
    at least one first ground plane, wherein the metal layers cover the V-groove and a dielectric medium separates the first signal path and the first ground plane.

3. The connector of claim 1 wherein the second part further comprises:
    a two metal layer structure;
    at least one second signal path; and
    at least one second ground plane, wherein the signal path partially covers the bump and a dielectric medium separates the second signal path and the second ground plane.

4. The connector of claim 1, wherein the conducting paths comprise metal layers having double density and covering the V-groove, said first part further comprises:
    at least one first signal path;
    at least one third signal path;
    at least one first ground plane; and
    a dielectric medium separating the first and third signal paths from the ground plane, and said second part further comprises:
    at least one second signal path;
    at least one fourth signal path;
    at least one second ground plane; and
    a dielectric medium separating the second and fourth signal paths from the ground plane, the second and fourth signal paths partially covering the bump and said first and second signal paths being in contact and said third and fourth signal paths being in contact when the first and second part are mating.

5. The connector of claim 1, wherein the conducting paths comprise metal layers having double density, said first part further comprises:
    at least one first signal path partially covering the V-groove;
    at least one first ground path; and
    a dielectric medium separating the first signal path and the first ground path, said second part further comprises:
    at least one second signal path;
    at least one second ground path; and
    a dielectric medium separating the second signal path and the second ground path, the metal layer covers the bump and thereby the second ground path covers the V-groove and the first and second signal paths being in contact and the first and second ground paths being in contact when the first and second part are mating.

* * * * *